(12) United States Patent
Ngo et al.

(10) Patent No.: US 6,746,971 B1
(45) Date of Patent: Jun. 8, 2004

(54) METHOD OF FORMING COPPER SULFIDE FOR MEMORY CELL

(75) Inventors: Minh Van Ngo, Fremont, CA (US); Sergey D. Lopatin, Santa Clara, CA (US); Suzette K. Pangrle, Cupertino, CA (US); Nicholas H. Tripsas, San Jose, CA (US); Hieu T. Pham, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/314,060

(22) Filed: Dec. 5, 2002

(51) Int. Cl.[7] .................. H01L 21/31; H01L 21/469
(52) U.S. Cl. ............... 438/780; 438/72; 438/92; 438/94; 438/95; 438/781; 438/782; 438/678
(58) Field of Search .................. 438/780, 781, 438/782, 72, 92, 94, 95, 603, 678, 99, 800

(56) References Cited

U.S. PATENT DOCUMENTS

| 4,663,270 | A | 5/1987 | Potember et al. ............ 430/495 |
|---|---|---|---|
| 5,589,692 | A | 12/1996 | Reed ............................ 257/23 |
| 6,055,180 | A | 4/2000 | Gudesen et al. ............. 365/175 |
| 6,208,553 | B1 | 3/2001 | Gryko et al. ................ 365/151 |
| 6,212,093 | B1 | 4/2001 | Lindsey ....................... 365/151 |
| 6,272,038 | B1 | 8/2001 | Clausen et al. .............. 365/181 |
| 6,314,019 | B1 | 11/2001 | Kuekes et al. .............. 365/151 |
| 6,320,200 | B1 | 11/2001 | Reed et al. ................... 257/40 |
| 6,324,091 | B1 | 11/2001 | Gryko et al. ................ 365/151 |
| 6,348,700 | B1 | 2/2002 | Ellenbogen et al. .......... 257/40 |
| 2003/0032292 | A1 | * 2/2003 | Noguchi ..................... 438/692 |
| 2003/0155602 | A1 | * 8/2003 | Krieger et al. .............. 257/306 |

* cited by examiner

Primary Examiner—Matthew Smith
Assistant Examiner—Igwe U. Anya
(74) Attorney, Agent, or Firm—Amin & Turocy, LLP

(57) ABSTRACT

An organic memory cell made of two electrodes with a controllably conductive media between the two electrodes is disclosed. The controllably conductive media contains an organic semiconductor layer and passive layer. The controllably conductive media changes its impedance when an external stimuli such as an applied electric field is imposed thereon. Methods of making the organic memory devices/cells, methods of using the organic memory devices/cells, and devices such as computers containing the organic memory devices/cells are also disclosed.

20 Claims, 4 Drawing Sheets

METHOD OF FORMING COPPER SULFIDE FOR MEMORY CELL

TECHNICAL FIELD

The present invention generally relates to forming copper sulfide regions or layers in memory devices. In particular, the present invention relates to forming copper sulfide passive layers in memory cells containing an organic semiconductor.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed. Electronic addressing or logic devices, for instance for storage or processing of data, are made with inorganic solid state technology, and particularly crystalline silicon devices. The metal oxide semiconductor field effect transistor (MOSFET) is one the main workhorses.

Much of the progress in making computers and memory devices faster, smaller and cheaper involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides methods of forming copper sulfide regions in organic memory cells that possess one or more of the following: small size compared to inorganic memory cells/devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

One aspect of the present invention relates to a method of making an organic memory cell involving providing a first electrode containing at least some copper, contacting a sulfide compound with the first electrode to form a copper sulfide region in the first electrode, forming an organic semiconductor layer over the copper sulfide region, and forming a second electrode over the organic semiconductor layer. The method my further involve heating the first electrode to remove copper oxide before contact with the sulfide compound. The sulfide compound may be contained in sulfide compound mixture.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

The present invention involves forming copper sulfide regions or layers for organic memory cells. The organic memory cells may be constituted by two electrodes with a controllably conductive media between the two electrodes. The controllably conductive media contains an organic semiconductor layer and a copper sulfide passive layer. The organic memory cells may optionally contain additional layers, such as additional electrodes, charge retention layers, and/or chemically active layers between or in addition to the two electrodes and the controllably conductive media.

Generally speaking, a copper sulfide passive region is formed in memory structure by initially and optionally removing or reducing copper oxide that be present on the copper structure. Copper oxide tends to be very porous, and thus by removing or reducing copper oxide if present, adhesion between the subsequently formed copper sulfide region and the organic semiconductor layer is improved. Moreover, removing copper oxide if present facilitates the formation of copper sulfide with the exposed or upper regions of the copper structure.

After optional copper oxide removal/reduction, a sulfide compound is contacted with the copper structure to form copper sulfide in a portion of the copper structure. A mask such as a patterned photoresist may cover portions of the copper structure surface, thus limiting copper sulfide formation to the exposed portions of the copper structure. The depth of the copper sulfide region within the copper structure depends upon a number of factors including the length of time the sulfide compound is in contact with the copper structure, the temperature, the concentration of the sulfide compound in the processing chamber, and the like.

To improve efficiency of the overall process, both copper oxide removal/reduction and copper sulfide formation can be conducted in the same processing chamber. Alternatively, different chambers may be employed for the copper oxide removal/reduction and copper sulfide formation.

Figure 1:
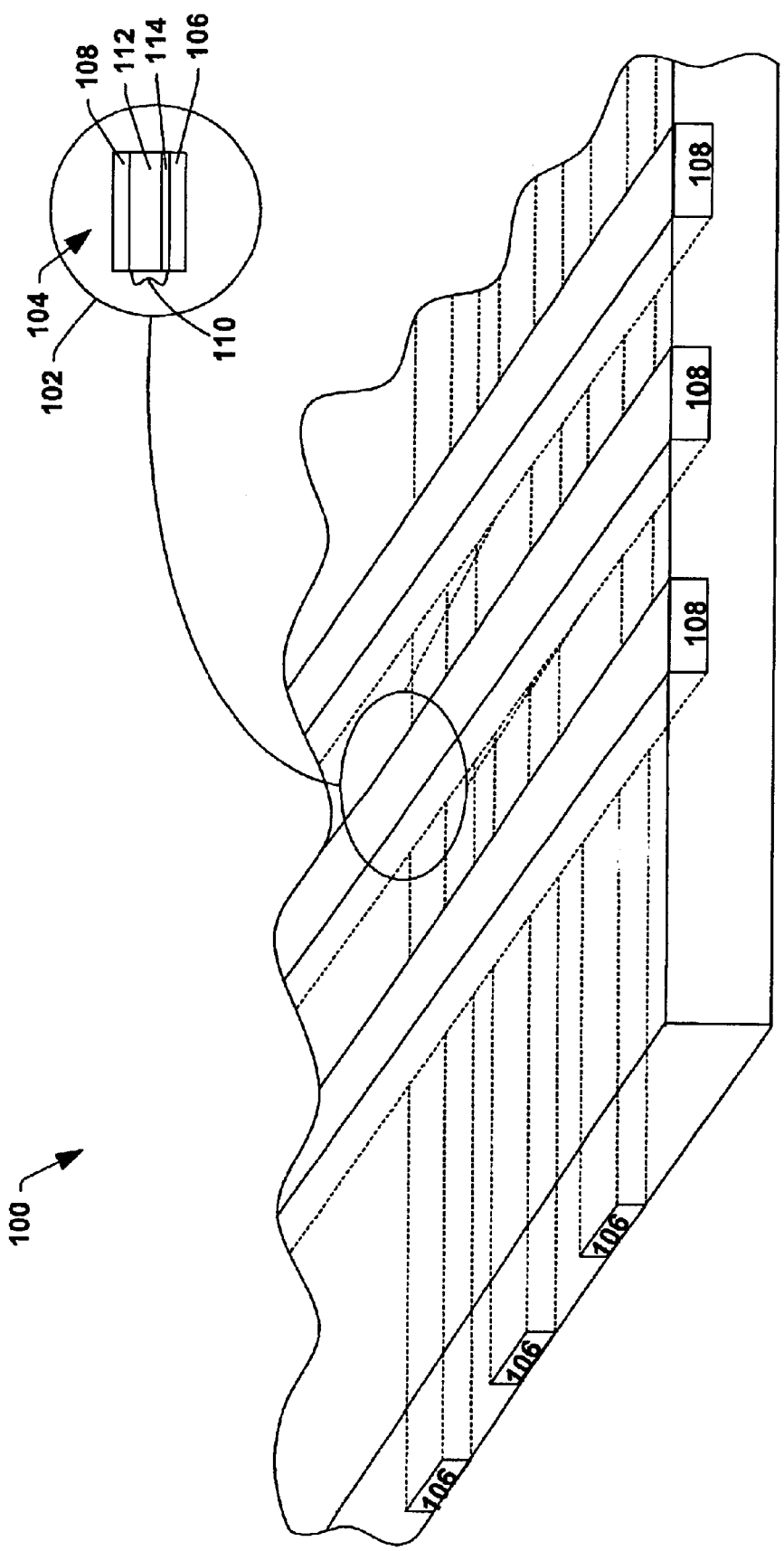
FIG. 1 illustrates a perspective view of a two dimensional microelectronic device containing a plurality of organic memory cells in accordance with one aspect of the invention.

Referring to FIG. 1, a brief description of a microelectronic organic memory device 100 containing a plurality of organic memory cells in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an organic semiconductor layer 112 and passive layer 114. Peripheral circuitry and devices are not shown for brevity.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

The electrode adjacent the passive layer of the controllably conductive media is either copper or contains a copper pad in which the copper sulfide region is formed in accordance with the present invention.

The controllably conductive media, disposed between the two electrodes, can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more passive layers. In one embodiment, the controllably conductive media contains at least one organic semiconductor layer that is adjacent a passive layer (without any intermediary layers between the organic semiconductor layer and passive layer).

The organic semiconductor layer contains at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6–C60 carbon nanotubes), and the like. Organic semiconductors thus have a carbon based structure, often a carbon-hydrogen based structure, which is different from conventional MOSFETs. The organic semiconductor materials are typically characterized in that they have overlapping π orbitals, and/or in that they have at least two stable oxidation states. The organic semiconductor materials are also characterized in that they may assume two or more resonant structures. The overlapping π orbitals contribute to the controllably conductive properties of the controllably conductive media. The amount of charge injected into the organic semiconductor layer also influences the degree of conductivity of the organic semiconductor layer.

A carbon nanotube is typically a hexagonal network of carbon atoms (from about 6 to about 60 carbon atoms, typically) that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminsterfullerene, a soccerball-shaped 60-atom cluster of pure carbon.

The organic polymer typically contains a conjugated organic polymer. The polymer backbone of the conjugated organic polymer extends lengthwise between the electrodes (generally substantially perpendicular to the inner, facing surfaces of the electrodes). The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the organic semiconductor layer, such as the conjugated organic polymer, has the ability to donate and accept charges (holes and/or electrons). Generally, the organic semiconductor or an atom/moiety in the polymer has at least two relatively stable oxidation states. The two relatively stable oxidation slates permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound.

The organic polymers (or the organic monomers constituting the organic polymers) may be cyclic or acyclic. During formation or deposition, the organic polymer self assembles between the electrodes. Examples of conjugated organic polymers include one or more of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like.

Chemical structures of examples of repeating units/moieties that make up the conjugated organic polymers and conjugated organometallic polymers include one or more of Formulae (I) to (XIII):

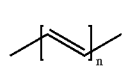

(I)

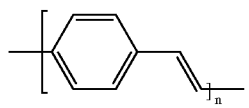

(II)

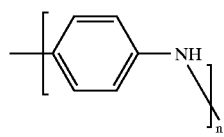

(III)

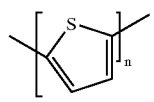

(IV)

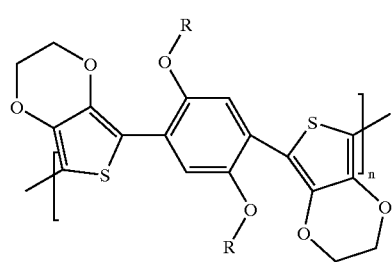

(V)

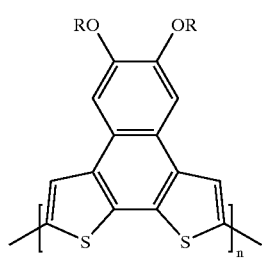

(VI)

-continued

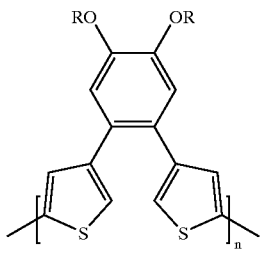
(VII)

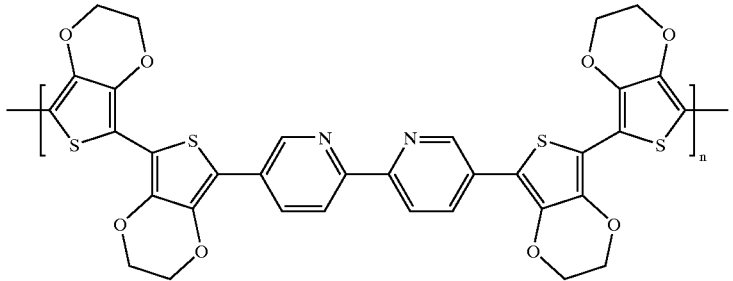
(VIII)

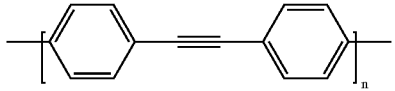
(IX)

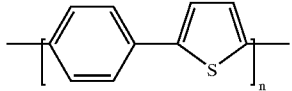
(XI)

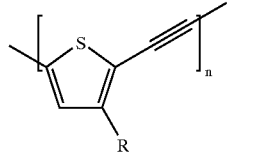
(X)

(XII)

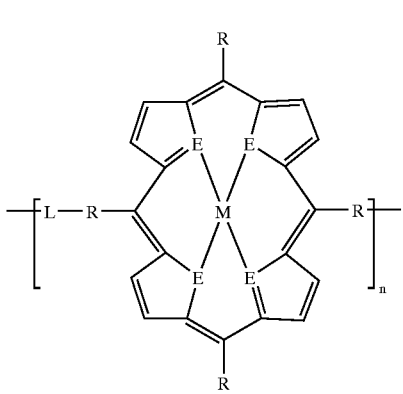
(XIII)

wherein each R is independently hydrogen or hydrocarbyl; each M is independently a metal; each E is independently O, N, S, Se, Te, or CH; each L is independently a group containing or continuing conjugation (unsaturation); and each n is independently about 1 or more and about 25,000 or less. In another embodiment, each n is independently about 2 or more and about 10,000 or less. In yet another embodiment, each n is independently about 20 or more and about 5,000 or less. Examples of metals include Ag, Al, Au, B, Cd, Co, Cu, Fe, Ga, Hg, Ir, Mg, Mn, Ni, Pb, Pd, Pt, Rh, Sn, and Zn. Examples of L groups include hydrocarbyl groups possessing conjugation or the ability to form resonance structures, such as phenyl groups, substituted phenyl groups, acetylene groups, aid the like.

Any of the formulae may have one or more pendent substituent groups, not shown in the formulae. For example, a phenyl group may appear on the polythiophene structure, such as on the 3 position of each thiophene moiety. As another example, alkyl, alkoxy, cyano, amino, and/or hydroxy substituent groups may be present on the phenyl rings in any of the polyphenylacetylene, polydiphenylacetylene, and poly(p-phenylene vinylene) conjugated polymers.

The term "hydrocarbyl" includes hydrocarbon as well as substantially hydrocarbon groups. Hydrocarbyl groups contain 1 or more carbon atom and typically about 60 or less carbon atoms. In another embodiment, hydrocarbyl groups contain 2 or more carbon atoms and about 30 or less carbon atoms. Substantially hydrocarbon describes groups which contain heteroatom substituents or heteroatoms which do not alter the predominantly organic character of the polymer, and do not impede the ability of the organic polymer to form a conjugated structure. Examples of hydrocarbyl groups include the following:

(1) hydrocarbon substituents, i.e., aliphatic (e.g., alkyl or alkenyl), alicyclic (e.g., cycloalkyl, cycloalkenyl) substituents, acyl, phenyl, aromatic-, aliphatic- and alicyclic-substituted aromatic substituents and the like as well as cyclic substituents wherein the ring is completed through another portion of the molecule (that is, for example, any two indicated substituents may together form an alicyclic radical);

(2) substituted hydrocarbon substituents, i.e., those substituents containing non-hydrocarbon groups which, in the context of this invention, do not alter the predominantly organic nature of the substituent; those skilled in the art will be aware of such groups (e.g., halo (especially chloro and fluoro, such as perfluoroalkyl, perfluoroaryl), cyano, thiocyanato, amino, alkylamino, sulfonyl, hydroxy, mercapto, nitro, nitroso, sulfoxy, etc.);

(3) heteroatom substituents, i.e., substituents which, while having a predominantly organic character within the context of this invention, contain an atom other than carbon present in a ring or chain otherwise composed of carbon atoms (e.g., alkoxy, alkylthio). Suitable heteroatoms will be apparent to those of ordinary skill in the art and include, for example, sulfur, oxygen, nitrogen, fluorine, chlorine, and such substituents as, e.g., pyridyl, furyl, thienyl, imidazolyl, imido, amido, carbamoyl, etc.

In one embodiment, the organic semiconductor layer contains a thin layer designed to improve or lengthen charge retention time. The thin layer may be disposed anywhere within the organic semiconductor layer, but typically near the middle of the layer. The thin layer contains any of the electrode materials or the compounds of the below-described heterocyclic/aromatic compound layer. In one embodiment, the thin layer has a thickness of about 50 Å or more and about 0.1 µm or less. In another embodiment, the thin layer has a thickness of about 100 Å or more and about 0.05 µm or less. For example, an organic memory cell may contain a first electrode of copper, a passive layer of copper sulfide, an organic semiconductor layer of poly(phenylene vinylene), and a second electrode of aluminum, wherein the poly(phenylene vinylene) organic semiconductor layer contains a 250 Å thick layer of copper therein.

In one embodiment, the organic semiconductor material does not contain an organometallic compound. In another embodiment, the organic semiconductor material contains an organic polymer doped with an organometallic compound. In yet another embodiment, the organic memory cells optionally contain an organometallic compound layer. In still yet another embodiment, the organic semiconductor material contains an organometallic compound. Examples of the chemical structures of various organometallic compounds include Formulae (XIV) to (XVII):

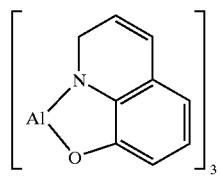
(XIV)

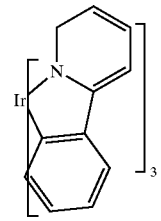
(XV)

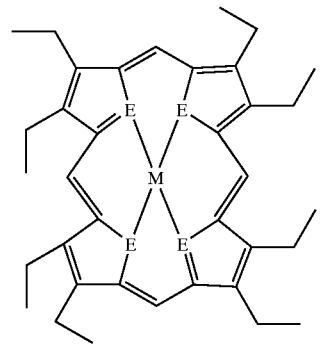
(XVI)

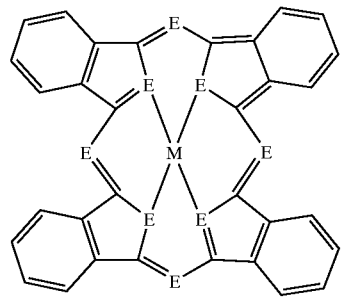
(XVII)

wherein M and E are as defined above.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 µm or more and about 5 µm or less. In another embodiment, the organic semiconductor layer has a thickness of about 0.01 µm or more and about 2.5 µm or less. In yet another embodiment, the organic semiconductor layer has a thickness of about 0.05 µm or more and about 1 µm or less.

The organic semiconductor layer may be formed by spin-on techniques (depositing a mixture of the polymer/ polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the organic semiconductor material self assembles between the electrodes. It is not typically necessary to functionalize one or more ends of the organic polymer in order to attach it to an electrode/passive layer.

A covalent bond may be formed between the organic semiconductor material and the passive layer. Alternatively, close contact is required to provide good charge carrier/electron exchange between the organic semiconductor layer and the passive layer. The organic semiconductor layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound has the ability to donate and accept charges (holes and/or electrons). The passive layer thus may transport between an electrode and the organic polymer layer/passive layer interface, facilitate charge carrier injection into the organic polymer layer, and/or increase the concentration of a charge carrier in the organic polymer layer. In some instances, the passive layer may store opposite charges thereby providing a balance of charges in the organic memory device as a whole. Storing charges/charge carriers is facilitated by the existence of two relatively stable oxidation states for the conductivity facilitating compound.

Generally, the conductivity facilitating compound or an atom in the conductivity facilitating compound has at least two relatively stable oxidation states. The two relatively stable oxidation states permit the conductivity facilitating compound to donate and accept charges and electrically interact with the organic semiconductor layer. The particular conductivity facilitating compound employed in a given organic memory cell is selected so that the two relatively stable oxidation states match with the two relatively stable oxidation states of the organic semiconductor material. Matching the energy bands of two relatively stable oxidation states of the organic semiconductor material and the conductivity facilitating compound facilitate charge carrier retention in the organic semiconductor layer.

Matching energy bands means that the fermi level of the passive layer is close to the valence band of the organic semiconductor layer. Consequently, the injected charge carrier (into the organic semiconductor layer) may recombine with the charge at the passive layer if the energy band of the charged organic semiconductor layer does not substantially change. Matching energy bands involves compromising between ease of charge injection and length of charge (data) retention time.

In one embodiment, when matching energy bands, the fermi level of the passive layer is within about 0.3 eV of the valence band of the organic semiconductor layer. In another embodiment, the fermi level of the passive layer is within about 0.25 eV of the valence band of the organic semiconductor layer. In yet another embodiment, the fermi level of the passive layer is within about 0.2 eV of the valence band of the organic semiconductor layer. In still yet another embodiment, the fermi level of the passive layer is within about 0.15 eV of the valence band of the organic semiconductor layer.

The applied external field can reduce the energy barrier between passive layer and organic layer depending on the field direction. Therefore, enhanced charge injection in the forward direction field in programming operation and also enhanced charge recombination in reversed field in erase operation can be obtained.

The copper sulfide passive layer may in some instances act as a catalyst when forming the organic semiconductor layer, particularly when the organic semiconductor layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the conjugated organic polymers are self aligned in a direction that traverses the two electrodes.

Examples of the conductivity facilitating compound that may constitute at least a portion of the passive layer is copper sulfide ($Cu_2S$, $CuS$) and copper rich copper sulfide ($CU_3S$, $Cu_2S/CuS$). The conductivity facilitating compound does not dissociate into ions under the strength of the electric field. The passive layer may contain two or more sub-passive layers.

The passive layer is formed in the following manner. A copper sulfide passive region is formed in an organic memory structure by initially and optionally removing or reducing copper oxide that be present on the copper structure. The copper oxide structure may be a copper electrode or a copper pad within an electrode, the electrode with a copper pad or copper electrode adjacent to the subsequently formed copper sulfide passive layer.

Copper oxide removal or reduction, if performed, is carried out in any suitable manner. For example, the structure containing the copper oxide coated copper may be heated at sufficient temperature and for a sufficient period of time to facilitate oxide removal/reduction. When heating the structure containing the copper oxide coated copper, the atmosphere contains one or more inert gases, with or without ammonia, and preferably consists essentially of one or more inert gases. In this connection, in one embodiment, when heating the structure containing the copper oxide coated copper, the atmosphere In one embodiment, the structure containing the copper oxide coated copper is heated from about 200° C. to about 500° C. In another embodiment, the structure containing the copper oxide coated copper is heated from about 300° C. to about 475° C. In yet another embodiment, the structure containing the copper oxide coated copper is heated from about 350° C. to about 450° C. In one embodiment, the structure containing the copper oxide coated copper is heated for a time from about 1 second to about 1 minute. In another embodiment, the structure containing the copper oxide coated copper is heated for a time from about 2 seconds to about 40 seconds. In yet another embodiment, the structure containing the copper oxide coated copper is heated for a time from about 3 seconds to about 20 seconds.

After optional copper oxide removal/reduction, a sulfide compound is contacted with the copper structure to form copper sulfide in a portion of the copper structure. The copper sulfide may be formed over the entire copper structure surface.

The sulfide compound is capable of reacting with copper to form copper sulfide within or on the original copper structure. Sulfide compounds include Group 1A element sulfides. Examples of sulfide compounds include hydrogen sulfide, lithium sulfide, sodium sulfide, potassium sulfide, and the like.

The sulfide compound is contacted with the copper structure in the form of a sulfide compound mixture. The sulfide compound mixture contains one or more sulfide compounds and at least one inert gas. Inert gases include nitrogen, and the noble gases, which include argon, helium, neon, krypton, and xenon. The sulfide compound mixture may be in the form of a gas, a plasma, or a combination of a gas and plasma.

In one embodiment, the sulfide compound mixture contains from about 0.1% to about 100% by weight of at least one sulfide compound and from about 0% to about 99.9% by weight of at least one inert gas. In another embodiment, the sulfide compound mixture contains from about 0.5% to about 20% by weight of at least one sulfide compound and from about 80% to about 99.5% by weight of at least one inert gas. In yet another embodiment, the sulfide compound mixture contains from about 1% to about 10% by weight of at least one sulfide compound and from about 90% to about 99% by weight of at least one inert gas. For example, the sulfide compound mixture may contain about 2% by weight of at least one sulfide compound and about 98% by weight of at least one inert gas, about 5% by weight of at least one sulfide compound and about 95% by weight of at least one inert gas, or about 10% by weight of at least one sulfide compound and about 90% by weight of at least one inert gas.

In one embodiment, the sulfide compound mixture does not contain water and/or sulfuric acid. In another embodiment, the sulfide compound mixture does not contain oxygen. In this connection, in one embodiment, the sulfide compound mixture consists essentially of at least one sulfide compound and optionally at least one inert gas.

The sulfide compound is contacted with the copper structure for a time sufficient to facilitate formation of copper sulfide in a portion of the copper structure. In one embodiment, the sulfide compound is contacted with the copper structure for a time from about 1 second to about 3 minutes. In another embodiment, the sulfide compound is contacted with the copper structure for a time from about 1 minute to about 10 minutes. In yet another embodiment, the sulfide compound is contacted with the copper structure for a time from about 30 seconds to about 1 minute. The chamber in which the sulfide compound is contacted with the copper structure may be equipped with a mass flow controller.

The sulfide compound is contacted with the copper structure at a temperature sufficient to facilitate formation of copper sulfide in a portion of the copper structure. In one embodiment, the sulfide compound is contacted with the copper structure at a temperature from about 150° C. to about 500° C. In another embodiment, the sulfide compound is contacted with the copper structure at a temperature from about 200° C. to about 450° C. In yet another embodiment, the sulfide compound is contacted with the copper structure at a temperature from about 250° C. to about 425° C. The chamber in which the sulfide compound is contacted with the copper structure may be equipped with a temperature controller.

The sulfide compound is contacted with the copper structure at a pressure sufficient to facilitate formation of copper sulfide in a portion of the copper structure. In one embodiment, the sulfide compound is contacted with the copper structure at a pressure from about 0.05 Torr to about 760 Torr. In another embodiment, the sulfide compound is contacted with the copper structure at a pressure from about 0.1 Torr to about 200 Torr. In yet another embodiment, the sulfide compound is contacted with the copper structure at a pressure from about 1 Torr to about 10 Torr.

The depth of the copper sulfide region within the copper structure depends upon a number of factors including the length of time the sulfide compound is in contact with the copper structure, the temperature, the concentration of the sulfide compound in the processing chamber, and the like.

In one embodiment, both copper oxide removal/reduction and copper sulfide formation is conducted in the same processing chamber. In another embodiment, different chambers are employed for the copper oxide removal/reduction and copper sulfide formation.

In some instances, to promote long charge retention limes (in the organic semiconductor layer), the passive layer may be treated with a plasma after it is formed. The plasma treatment, which may contain an inert gas, modifies the energy barrier of the passive layer.

In one embodiment, the passive layer containing the conductivity facilitating compound has a thickness of about 2 Å or more and about 0.1 μm or less. In another embodiment, the passive layer has a thickness of about 10 Å or more and about 0.01 μm or less. In yet another embodiment, the passive layer has a thickness of about 50 Å or more and about 0.005 μm or less.

In order to facilitate operation of the organic memory cells, the organic semiconductor layer is thicker than the passive layer. In one embodiment, the thickness of the organic semiconductor layer is from about 10 to about 500 times greater than the thickness of the passive layer. In another embodiment, the thickness of the organic semiconductor layer is from about 25 to about 250 times greater than the thickness of the passive layer.

In one embodiment, the organic memory cells optionally contain a heterocyclic/aromatic compound layer. In another embodiment, the organic semiconductor layer is doped with a heterocyclic/aromatic compound. If present, the heterocyclic/aromatic compound layer has a thickness of about 0.001 μm or more and about 1 μm or less. Examples of the chemical structures of various heterocyclic/aromatic compounds specifically including nitrogen containing heterocycles, include Formulae (XVIII) to (XXIII):

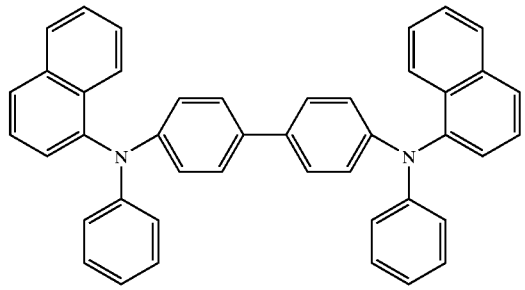

(XVIII)

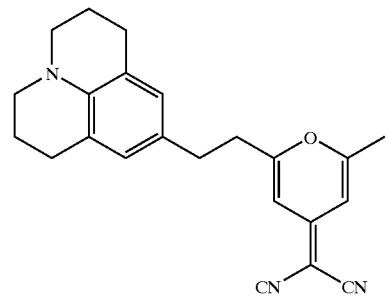

(XIX)

-continued

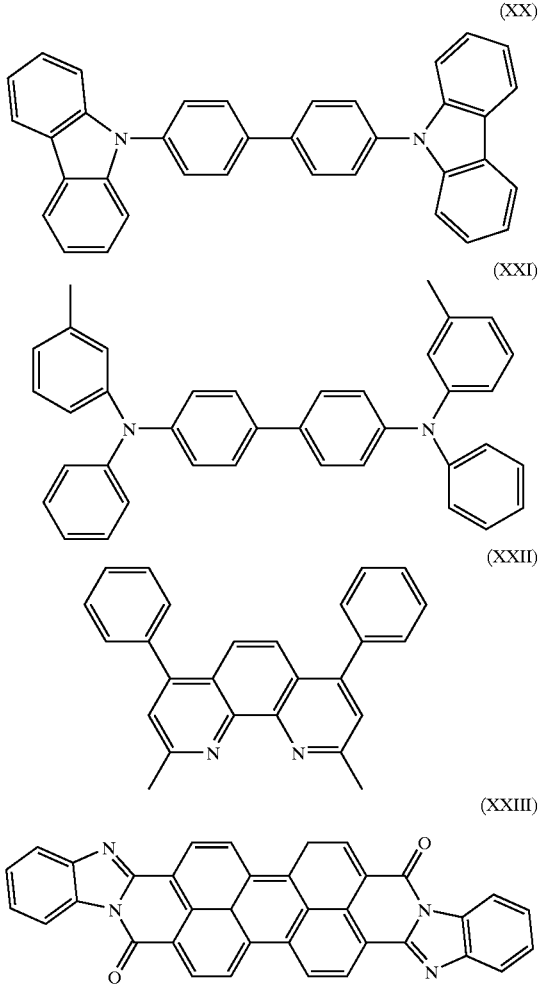

(XX)

(XXI)

(XXII)

(XXIII)

The area size of the individual organic memory cells (as measured by the surface area of the two electrodes directly overlapping each other) can be small compared to conventional silicon based inorganic memory cells such as metal oxide semiconductor field effect transistors (MOSFETs). In one embodiment, the area size of the organic memory cells of the present invention is about 0.0001 $\mu m^2$ or more and about 4 $\mu m^2$ or less. In another embodiment, the area size of the organic memory cells is about 0.001 $\mu m^2$ or more and about 1 $\mu m^2$ or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value ("on" state) permits an applied voltage to write or erase information into/from the organic memory cell and the presence of an external stimuli such as an applied electric field that is less than a threshold value permits an applied voltage to read information from the organic memory cell; whereas the absence of the external stimuli that exceeds a threshold value ("off" state) prevents an applied voltage to write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance slate or a high impedance state (and thus whether it is "on" or "off"). To erase information written into the organic memory cell, a negative voltage or a polarity opposite the polarity of the writing signal that exceeds a threshold value is applied.

The organic memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The organic memory devices may be fabricated in planar orientation (two dimensional) or three dimensional orientation containing at least two planar arrays of the organic memory cells.

Figure 2:
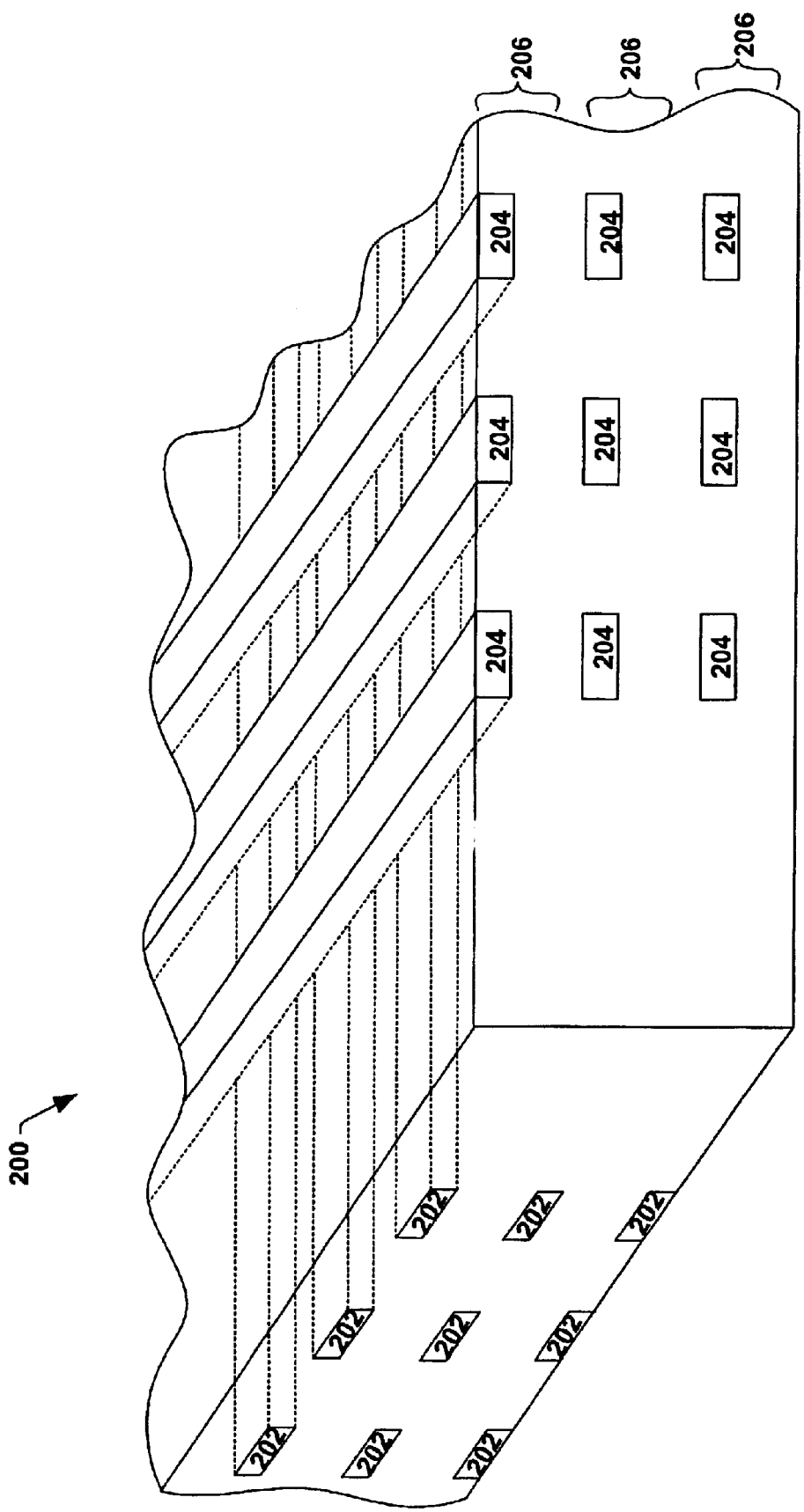
FIG. 2 illustrates a perspective view of a three dimensional microelectronic device containing a plurality of organic memory cells in accordance with another aspect of the invention.
Figure 3:
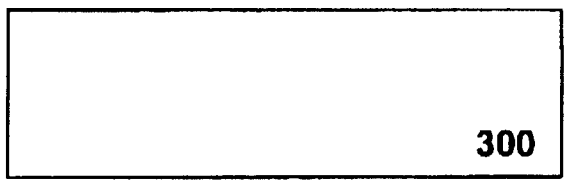
FIG. 3 shows a cross sectional view of forming a copper sulfide region in accordance with one aspect of the invention.

Referring to FIG. 2, a three dimensional microelectronic organic memory device 200 containing a plurality of organic memory cells in accordance with an aspect of the invention is shown. The three dimensional microelectronic organic memory device 200 contains a plurality of first electrodes 202, a plurality of second electrodes 204, and a plurality of memory cell layers 206. Between the respective first and second electrodes are the controllably conductive media (not shown). The plurality of first electrodes 202 and the plurality of second electrodes 204 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The impedance of the controllably conductive media changes when an external stimuli such as an applied electric field is imposed. A plurality of organic memory cells, which may be referred to as an array, form an organic memory device. In this connection, organic memory cells may form an organic memory devices and function in a manner analogous to MOSFETs in conventional semiconductor memory devices.

Referring to FIGS. 3 to 6 and FIGS. 7 to 10, two of many possible exemplary embodiments of forming a copper sulfide passive region are illustrated. Specifically referring to FIG. 3, an electrode 300 containing copper is provided. The electrode 300 may be a layer of copper or a copper alloy layer.

Figure 4:
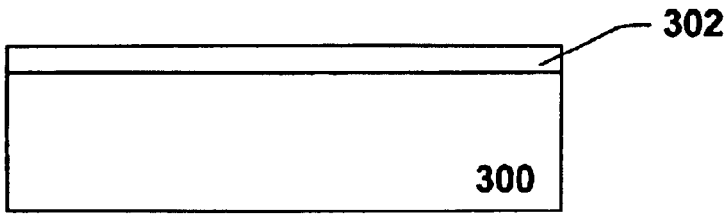
FIG. 4 shows a cross sectional view of forming a copper sulfide region in accordance with one aspect of the invention.

Referring to FIG. 4, a copper oxide layer 302 may form over the electrode 300 containing copper. Often times, the thickness of the copper oxide layer 302 is a function of time when the electrode 300 containing copper is exposed to the ambient atmosphere. That is, oxygen normally present in air can oxidize the surface of a copper or copper alloy metal.

Figure 5:
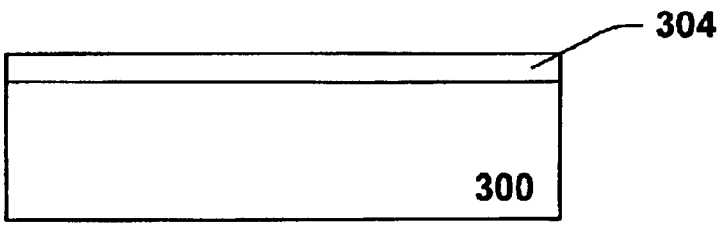
FIG. 5 shows a cross sectional view of forming a copper sulfide region in accordance with one aspect of the invention.

Referring to FIG. 5, the structure is heated to a temperature from about 200° C. to about 500° C. for a time from about 1 second to about 3 minutes to remove the copper oxide layer 302 from the electrode 300 containing copper. For example, the structure is heated to a temperature of about 400° C. for 15 seconds to remove the copper oxide layer 302 from the electrode 300 containing copper. After the copper oxide layer 302 is removed, within the same chamber a sulfide compound mixture containing at least one sulfide compound and at least one inert gas is contacted with the electrode 300 for a time from about 1 second to about 15 minutes at a temperature from about 150° C. to about 500° C. to form a copper sulfide region 304 within the electrode 300. For example, a mixture containing about 10% by weight of hydrogen sulfide and about 90% by weight of nitrogen is contacted with the electrode 300 for about 45 seconds at a temperature of about 375° C. to form copper sulfide region 304.

The copper oxide reduction/removal is optional in the sense that the copper sulfide region may be formed in the electrode 300 containing copper before copper oxide forms on the electrode 300 surface.

Figure 6:
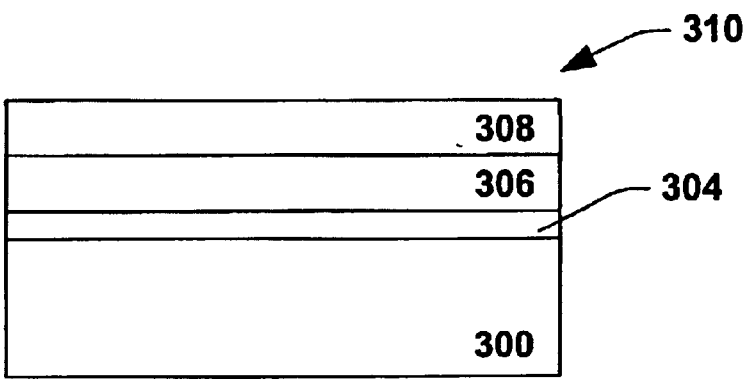
FIG. 6 shows a cross sectional view of forming a copper sulfide region in accordance with one aspect of the invention.

Referring to FIG. 6, an organic semiconductor layer 306 containing an organic semiconductor such as polyphenylacetylene and is formed over the copper sulfide region 304 using CVD techniques. Another electrode 308 is formed over the organic semiconductor layer 306 to provide organic memory cell 310. The electrode 308 may contain any of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal suicides; Hastelloy®, Kovar®, Invar, Monel®, Inconel®, brass, stainless steel, or magnesium-silver alloy. In this example, the electrode 308 contains aluminum.

Figure 7:
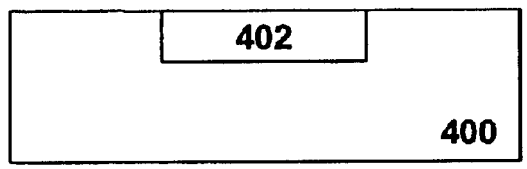
FIG. 7 shows a cross sectional view of forming a copper sulfide region in accordance with one aspect of the invention.

Referring to FIG. 7, an structure 400 containing a copper pad 402 is provided. The structure 400 may be a layer of a dielectric, copper, a copper alloy layer, aluminum, chromium, germanium, gold, magnesium, manganese, indium, iron, nickel, palladium, platinum, silver, titanium, zinc, and alloys thereof; indium-tin oxide (ITO); polysilicon; doped amorphous silicon; metal silicides; Hastelloy®, Kovar®, Invar, Monel®, Inconel®, brass, stainless steel, or magnesium-silver alloy. The copper pad 402 contains copper or a copper alloy. If the structure 400 is made of dielectric, then the copper pad 402 may function as an electrode. If the structure 400 is made of a conductive material, then the structure 400 and copper pad 402 together may function as an electrode.

Figure 8:
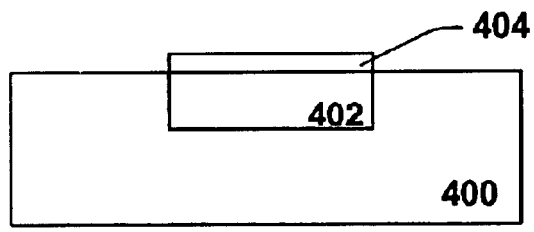
FIG. 8 shows a cross sectional view of forming a copper sulfide region in accordance with one aspect of the invention.

Referring to FIG. 8, a copper oxide layer 404 may form over the copper pad 402. Often times, the thickness of the copper oxide layer 404 is a function of time when the copper pad 402 is exposed to the ambient atmosphere. That is, oxygen normally present in air can oxidize the surface of a copper or copper alloy metal.

Figure 9:
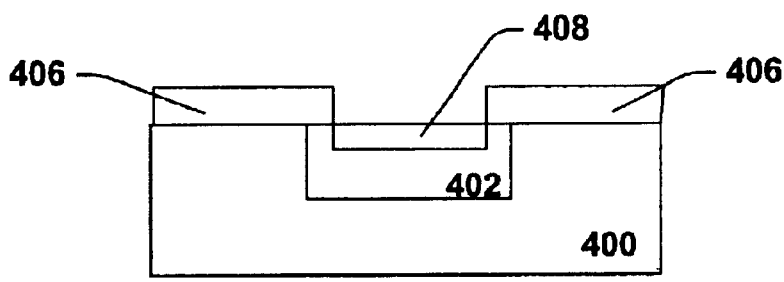
FIG. 9 shows a cross sectional view of forming a copper sulfide region in accordance with one aspect of the invention.

Referring to FIG. 9, the structure is heated to a temperature from about 200° C. to about 500° C. for a time from about 1 second to about 3 minutes to remove the copper oxide layer 404 from the copper pad 402. For example, the structure is heated to a temperature of about 410° C. for 12 seconds to remove the copper oxide layer 404 from the copper pad 402.

After the copper oxide layer 404 is removed, a mask 406 such as a photoresist is formed, is optionally formed over the structure, the mask 406 having openings corresponding with the subsequently formed copper sulfide regions. A sulfide compound mixture containing at least one sulfide compound and at least one inert gas is contacted with the electrode 300 for a time from about 1 second to about 15 minutes at a temperature from about 150° C. to about 500° C. to form a copper sulfide region 408 within the copper pad 402. For example, a mixture containing about 2% by weight of hydrogen sulfide and about 98% by weight of nitrogen is contacted with the copper pad 402 for about 2 minutes at a temperature of about 360° C. to form copper sulfide region 408.

The copper oxide reduction/removal is optional in the sense that the copper sulfide region may be formed in the copper pad 402 before copper oxide forms on the copper pad surface.

Figure 10:
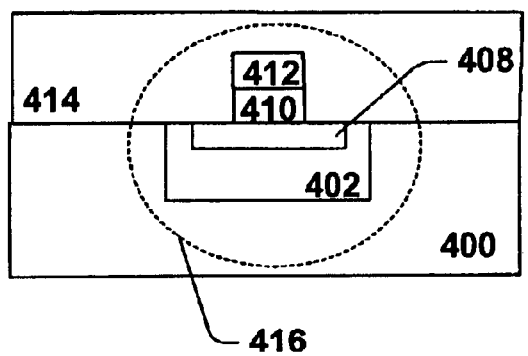
FIG. 10 shows a cross sectional view of a memory cell with a copper sulfide region formed in accordance with one aspect of the invention.

Referring to FIG. 10, an organic semiconductor layer 410 containing an organic semiconductor such as polyacetylene and is formed over the copper sulfide region 408 using CVD techniques. Another electrode 412 is formed over the organic semiconductor layer 410. A dielectric encasement layer 414 is formed thereover. Consequently, organic memory cell 416 is provided. The electrode 412 may contain any of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; Hastelloy®, Kovar®, Invar, Monel®, Inconel®, brass, stainless steel, or magnesium-silver alloy. In this example, the electrode 412 contains aluminum.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making an organic memory cell comprising:

providing a first electrode comprising at least copper;

contacting a sulfide compound with the first electrode to form a copper sulfide region in a portion of the first electrode, wherein the sulfide compound is contacted with the first electrode for a time from about 1 minute to about 10 minutes at a temperature from about 200° C. to about 450° C.;

forming an organic semiconductor layer over the copper sulfide region, the organic semiconductor layer comprising at least one of a conjugated organic polymer, a conjugated organometallic compound, a conjugated organometallic polymer, a buckyball, and a carbon nanotube; and forming a second electrode over the organic semiconductor layer.

2. The method of claim 1, wherein the sulfide compound is contacted with the first electrode at a temperature from about 250° C. to about 425° C.

3. The method of claim 1, wherein the sulfide compound comprises hydrogen sulfide.

4. The method of claim 1, wherein the sulfide compound comprises at least one Group IA element sulfide.

5. The method of claim 1, wherein the sulfide compound is in a sulfide compound mixture comprising from about 0.1% to about 100% by weight of the sulfide compound and from about 0% to about 99.9% by weight of at least one inert gas.

6. The method of claim 1, wherein the organic semiconductor layer comprises at least one conjugated organic polymer selected from the group consisting of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes, polyphthalocyanines; polyvinylenes; and polystiroles.

7. The method of claim 1, wherein the second electrode comprises at least one selected from the group consisting of aluminum, chromium, copper, germanium, gold, magnesium, manganese, indium, iron, nickel, palladium, platinum, silver, titanium, zinc, and alloys thereof; indium-tin oxide; polysilicon; doped amorphous silicon; and metal silicides.

8. The method of claim 1, wherein the organic semiconductor layer has a thickness of about 0.001 μm or more and about 5 μm or less and the copper sulfide region has a thickness of about 2 Å or more and about 0.1 μm or less.

9. A method of making an organic memory cell comprising:

providing a first electrode comprising at least a copper portion, wherein the copper portion has a copper oxide layer thereover;

heating the first electrode to remove the copper oxide layer from the copper portion;

contacting a sulfide compound mixture with the first electrode to form a copper sulfide region in the copper portion of the first electrode, wherein the sulfide compound mixture comprises from about 0.5% to about 20% by weight of at least one sulfide compound and from about 80% to about 99.5% by weight of at least one inert gas;

forming an organic semiconductor layer over the copper sulfide region, the organic semiconductor layer comprising at least one of a conjugated organic polymer, a conjugated organometallic compound, a conjugated organometallic polymer, a buckyball, and a carbon nanotube; and forming a second electrode over the organic semiconductor layer.

10. The method of claim 9, wherein the sulfide compound mixture is contacted with the first electrode for a time from about 15 seconds to about 1 minute at a temperature from about 200° C. to about 450° C.

11. The method of claim 9, wherein heating the first electrode to remove the copper oxide layer and contacting the sulfide compound mixture with the first electrode are conducted in the same processing chamber.

12. The method of claim 9, wherein the first electrode is heated at a temperature from about 200° C. to about 500° C. for a time from about 1 second to about 1 minute to remove the copper oxide layer from the copper portion.

13. The method of claim 9, wherein the sulfide compound mixture comprises hydrogen sulfide.

14. The method of claim 13, wherein the at least one inert gas is selected from the group consisting of nitrogen, argon, helium, neon, krypton, and xenon.

15. A method of making an organic memory cell comprising:

providing a first electrode comprising copper;

contacting hydrogen sulfide with the first electrode to form a copper sulfide region in a portion of the first electrode, wherein the hydrogen sulfide is contacted with the first electrode for a time from about 1 second to about 3 minutes at a temperature from about 150° C. to about 500° C.;

forming an organic semiconductor layer over the copper sulfide region, the organic semiconductor layer comprising at least one of a conjugated organic polymer, a conjugated organometallic compound, a conjugated organometallic polymer, a buckyball, and a carbon nanotube; and forming a second electrode over the organic semiconductor layer.

16. The method of claim 15, wherein the hydrogen sulfide is contacted with the first electrode for a time from about 15 seconds to about 1 minute at a temperature from about 200° C. to about 450° C.

17. The method of claim 15, prior to contacting hydrogen sulfide with the first electrode, heating the first electrode at a temperature from about 200° C. to about 500° C. for a time from about 1 second to about 3 minutes to remove any copper oxide therefrom.

18. The method of claim 15, wherein the hydrogen sulfide is in a hydrogen sulfide compound mixture comprising from about 0.5% to about 20% by weight of hydrogen sulfide and from about 80% to about 99.5% by weight of at least one inert gas.

19. The method of claim 15, wherein the organic semiconductor layer comprises at least one conjugated organic polymer selected from the group consisting of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes, polyphthalocyanines; polyvinylenes; and polystiroles.

20. The method of claim 15, wherein the organic semiconductor layer comprises a conjugated organic polymer, and the conjugated organic polymer is formed by chemical vapor deposition and a catalytic action of the copper sulfide region.

* * * * *